United States Patent [19]
Dennison et al.

[11] Patent Number: 5,340,765
[45] Date of Patent: Aug. 23, 1994

[54] METHOD FOR FORMING ENHANCED CAPACITANCE STACKED CAPACITOR STRUCTURES USING HEMI-SPHERICAL GRAIN POLYSILICON

[75] Inventors: Charles H. Dennison; Randhir P. S. Thakur, both of Boise, Id.

[73] Assignee: Micron Semiconductor, Inc., Boise, Id.

[21] Appl. No.: 106,503

[22] Filed: Aug. 13, 1993

[51] Int. Cl.⁵ .................. H01L 21/70; H01L 27/00
[52] U.S. Cl. ............................ 437/52; 437/60; 437/193; 437/919; 437/233; 148/DIG. 138
[58] Field of Search ............... 437/47, 52, 60, 919

[56] References Cited

U.S. PATENT DOCUMENTS 5,061,650 10/1991 Dennison et al. .................. 437/47
5,162,248 11/1992 Dennison et al. .................. 437/52

FOREIGN PATENT DOCUMENTS 1-257365 10/1989 Japan.

OTHER PUBLICATIONS

"Hemispherical Grain Silicon for High Density DRAMs", Watanabe et al., Jul. 1992, Solid State Technology.
"Control of Polysilicon emitter bipolar transistor Characteristics by Rapid Thermal or Furance anneal of the Polysilicon/silicon Interface", Bhattacharya et al., Mat. Res. Soc. Symp. Proc. vol. 283, 1993 Materials Research Society, pp. 721–726.
"A New Cylindrical Capacitor using Hemispherical Grained Si(HSG-Si) for 256Mb DRAMs", Watanabe et al., 1992 IEDM, pp. 259–262.
"Capacitance-Enhanced Stacked-Capacitor for Deep Submicron DRAMs", Mine et al, Extended Abstracts of the 21st Conference on Solid State Devices and Materials, 1989, pp. 137–140.
"A 1.28 μm² Bit-line Shielded Memory Cell Technology for 64mb DRAMs", Kawamoto et al., Symposium on VLSI Technology, pp. 13–14 (Date Unknown).
"Crystallization of Amorphous Silicon with Clean Surfaces", Sakai et al., IEEE Transactions on Electron Devices, vol. 30, No. 6A, Jun. 1991, pp. L941–L943.
"Highly Reliable 20nm inter-poly dielectric", IEDM 89, pp. 592–594 (1989).
"A Capacitor-Over-Bit-Line(COB) with a Hemispherical-Grain Storage Node for 64Mb DRAMs", Sakao et al., IEDM 90, pp. 655–658 (1990).

*Primary Examiner*—Olik Chaudhuri
*Assistant Examiner*—H. Jey Tsai
*Attorney, Agent, or Firm*—David J. Paul

[57] ABSTRACT

The present invention develops a container capacitor by forming a conductively doped polysilicon plug between a pair of neighboring parallel conductive word lines; forming a planarized tetra-ethyl-ortho-silicate (TEOS) insulating layer over the parallel conductive word lines and the plug; forming a planarized borophosphosilicate glass (BPSG) insulating layer over the planarized tetra-ethyl-ortho-silicate (TEOS) insulative layer; forming an opening into both insulating layers to expose an upper surface of the plug, the opening thereby forming a container shape; forming first, second and third layers of conductively doped amorphous silicon into the container shape while simultaneously bleeding oxygen into the amorphous silicon; forming individual container structures having inner and outer surfaces and thereby exposing the BPSG insulating layer; removing the BPSG insulating layer thereby exposing the outer surface of the container structures; converting the exposed inner and outer surfaces of amorphous silicon into hemispherical grained polysilicon by subjecting the structures to a high vacuum anneal; forming a nitride insulating layer adjacent and coextensive the conductive container structure; and forming a second conductively doped polysilicon layer superjacent and coextensive the nitride insulating layer.

34 Claims, 9 Drawing Sheets

METHOD FOR FORMING ENHANCED CAPACITANCE STACKED CAPACITOR STRUCTURES USING HEMI-SPHERICAL GRAIN POLYSILICON

CROSS REFERENCE TO A RELATED APPLICATION

This application is related to U.S. Pat. No. 5,278,091.

FIELD OF THE INVENTION

This invention relates to semiconductor circuit memory storage devices and more particularly to a process for fabricating three-dimensional stacked capacitor structures that may be used in such storage devices as high-density dynamic random access memories (DRAMs).

BACKGROUND OF THE INVENTION

In dynamic semiconductor memory storage devices it is essential that storage node capacitor cell plates be large enough to retain an adequate charge (or capacitance) in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices.

The ability to densely pack storage cells while maintaining required capacitance levels is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two or more layers of a conductive material such as polycrystalline silicon (polysilicon or poly) are deposited over an access device on a silicon wafer, with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining good dielectric breakdown characteristics between poly layers in the STC capacitor becomes a major concern once insulator thickness is appropriately scaled.

U.S. Pat. No. 5,162,248, having the same assignee as does the present invention, is a related process to form a container cell. All publications cited herein are hereby incorporated by reference.

SUMMARY OF THE INVENTION

The present invention develops a process for fabricating a conductive container structure on a supporting substrate by forming a pair of neighboring parallel conductive lines; forming a first planarized insulating layer over the parallel conductive lines; forming a planarized second insulating layer over the first planarized insulative layer; forming an opening into the second insulating layer and the first insulating layer, the opening thereby forming a container shape; forming multiple layers of silicon into the container shape with the interface of these layers defined by a thin interfacial layer of contamination, such as oxygen, that will impede any atomic silicon migration during subsequent high vacuum annealing (but will not block conduction); forming individual container structures having inner and outer surfaces and thereby exposing the second insulating layer; removing the second insulating layer thereby exposing the outer surface of the container structures; converting the exposed inner and outer surfaces of amorphous silicon into hemispherical grained polysilicon by subjecting the structures to a high vacuum anneal; forming a third insulating layer adjacent and coextensive the conductive container structure; and forming a second conductive layer superjacent and coextensive the third insulating layer.

DETAILED DESCRIPTION OF THE PRESENT INVENTION

The present invention is directed to maximizing storage cell surface area by providing uniform, storage cell structures across a given supporting substrate, in a high density/high volume DRAM fabrication process. The following process steps described below serve as an example as well as a preferred method of implementing the present invention. However, the example is not intended to limit a broad scope of the invention.

Figure 1:
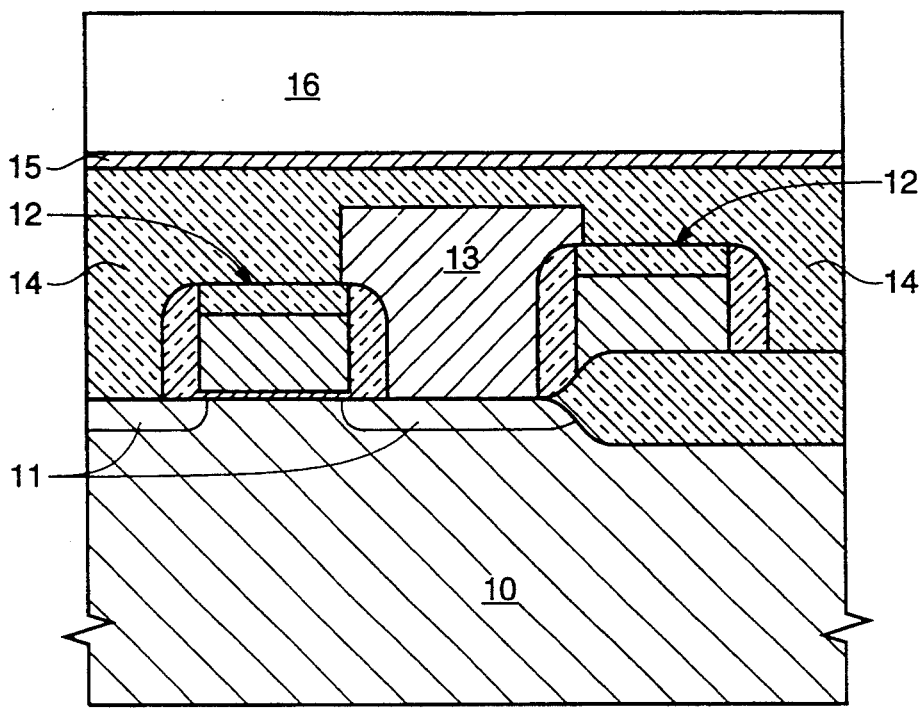
FIG. 1 is a composite cross-sectional view of an in-process wafer portion depicting the beginning steps of the present invention, whereby a polysilicon plug has been formed between two word lines, followed by a planarized layer tetra-ethyl-ortho-silicate (TEOS) oxide, deposition of nitride film and a planarized layer of borophosphosilicate glass (BPSG)

As shown in FIG. 1, a supporting substrate, such as a silicon wafer, is prepared using conventional process steps to form a conductively doped poly plug 13 residing between neighboring word lines 12 and making contact to diffusion region 11 of substrate 10. Planarized oxide 14 insulates word lines 12 and poly plug 13. On top of planarized oxide 14 is formed a thin film of nitride 15. This nitride 15 is optional as will be discussed further in the process. Then nitride 15 is blanketed with another planarized oxide layer 16. The wafer has been processed up to the point of processing an array of storage cell capacitors. Capacitor cell fabrication will now follow.

The storage capacitor of each memory cell will make contact to the underlying diffusion region 11 via poly plug 13. Each underlying diffusion region 11 will have two storage node connections isolated from a single digit line contact by access transistors formed by poly word lines 12 crossing the active area. Normally each diffusion region 11 within the array is isolated from one another by a thick field oxide. Diffusion regions 11 and the poly word lines 12 (control gates) form active field effect transistors (FETS serving as access transistors to each individual capacitor) that can be doped as NMOS or PMOS type FETs depending on the desired use.

Figure 2A:
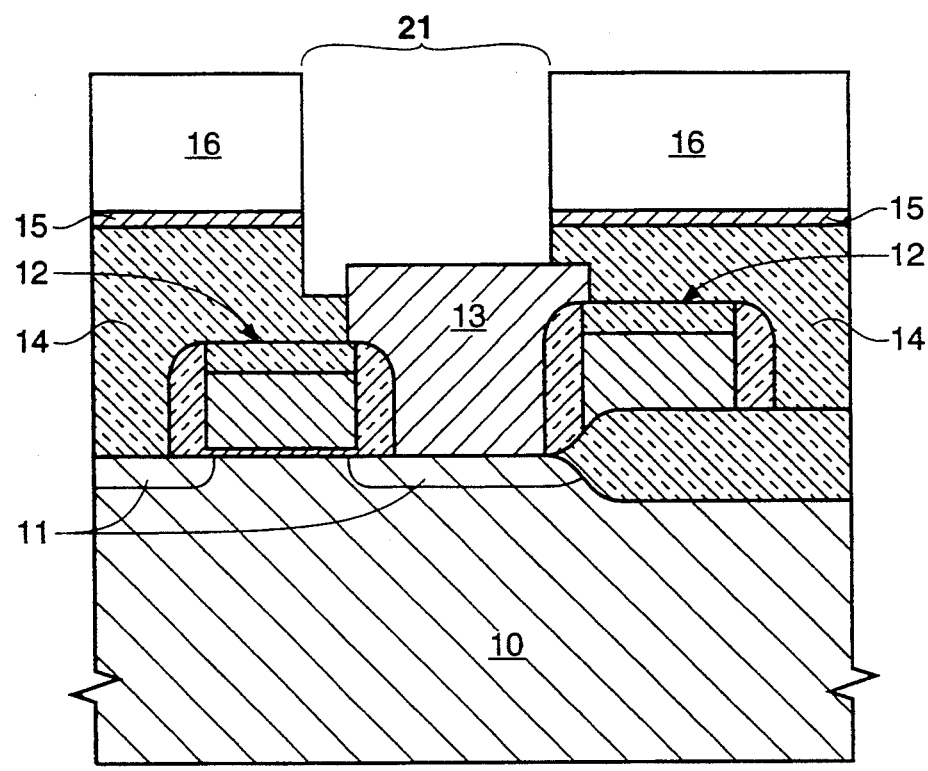
FIGS. 2A and 2B are is a cross-sectional view of the in-process wafer portion of FIG. 1 after a contact opening exposing the poly plug.
Figure 2B:
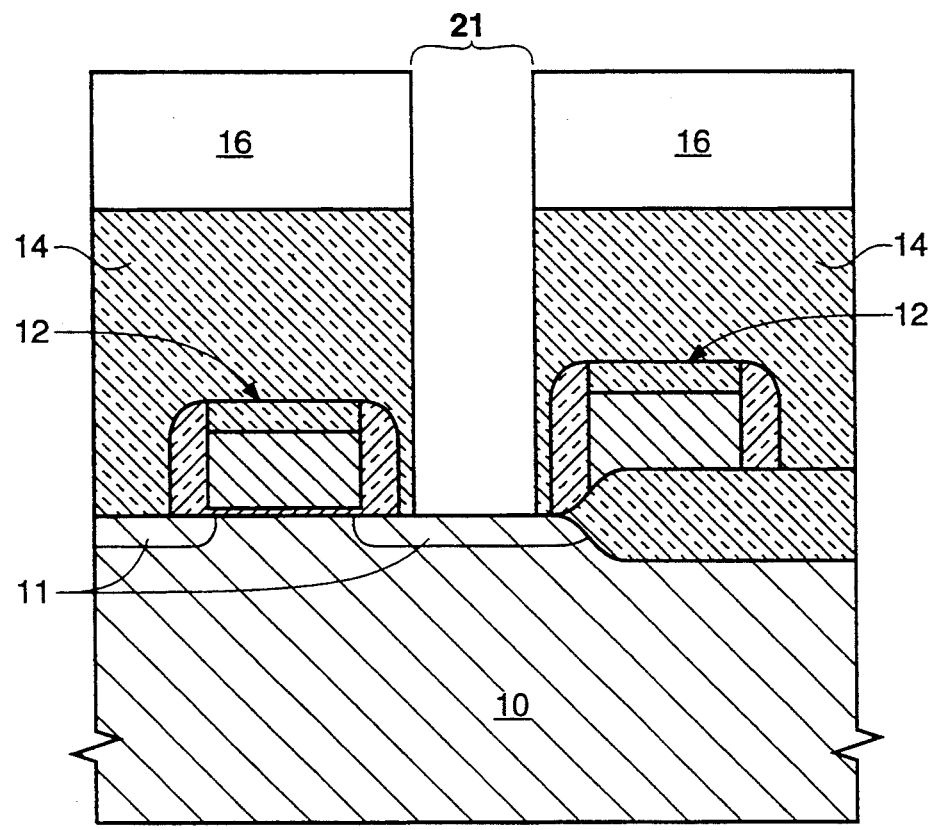

Referring now to FIG. 2a, the thickness of planarized oxide layer 16 depends on the height that is desired for the poly container structure yet to be formed. The height of the resulting poly structure will be one of the factors in determining the resulting capacitor plate surface area desired. A contact opening 21 is etched into oxide 16, nitride 15 and oxide 14, thereby allowing access to the underlying poly plug 13. Contact opening 21 not only allows access to the underlying topography but also provides a form at contact opening 21 for a subsequently placed layer of conductively doped thin poly. (Alternatively, the contact opening may be etched down to diffusion area 11, as a poly plug need not be present, as shown in FIG. 2b.)

Figure 3:
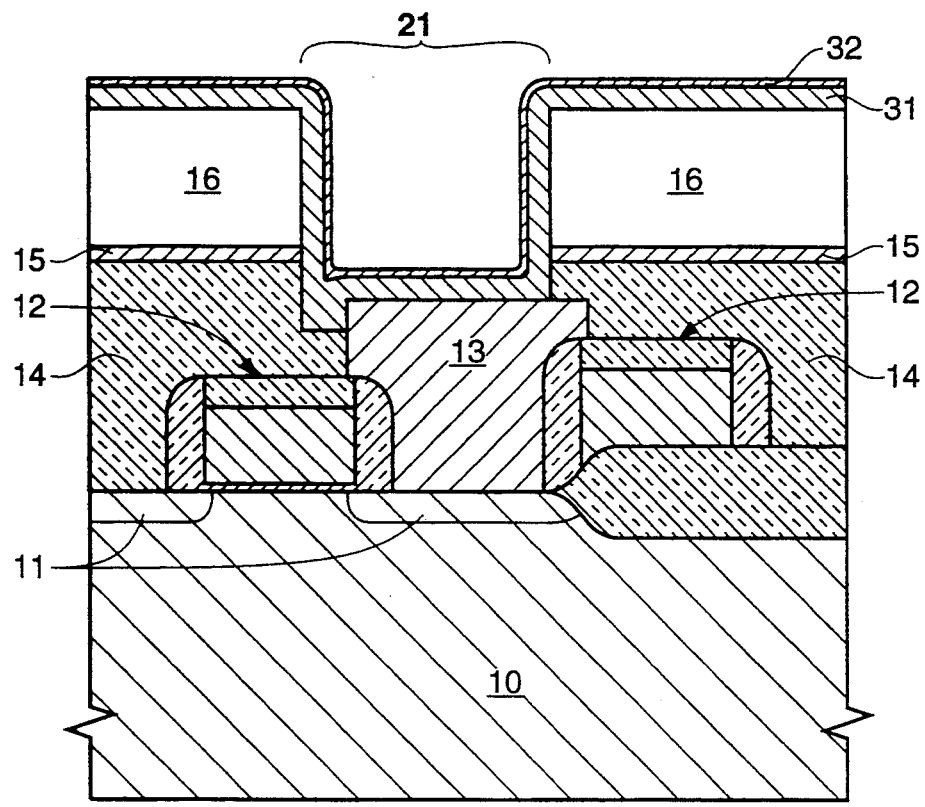
FIG. 3 is a cross-sectional view of the in-process wafer portion of FIG. 2 after a deposition of a first layer of amorphous silicon followed by a controlled exposure to oxygen.
Figure 4:
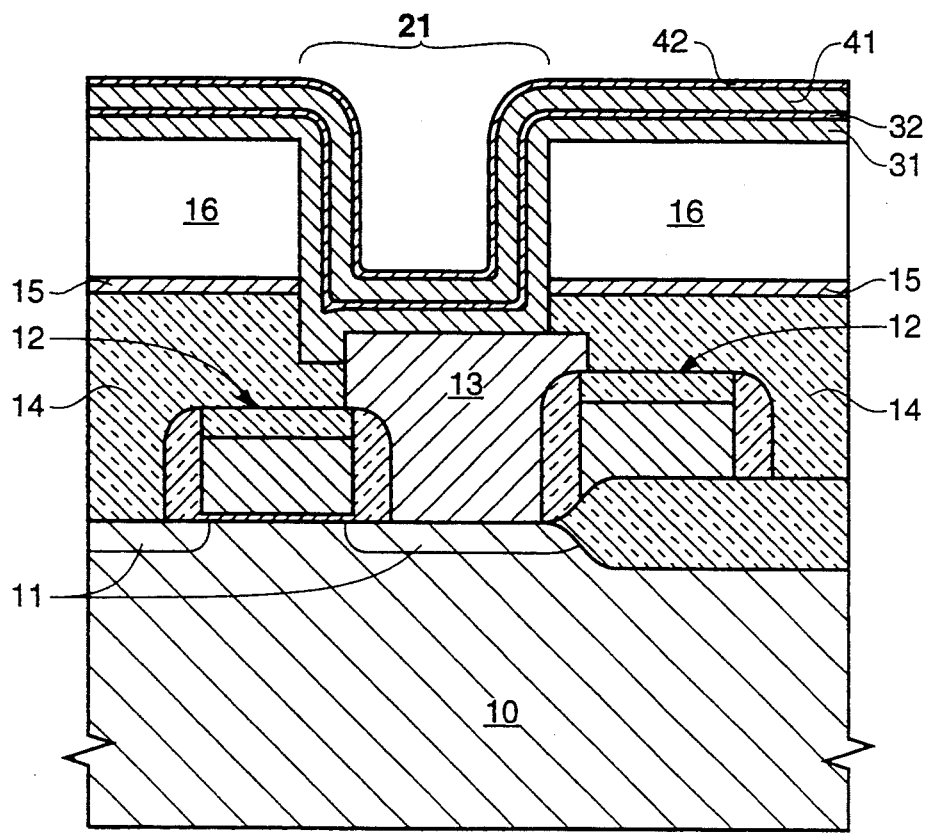
FIG. 4 is a cross-sectional view of the in-process wafer portion of FIG. 3 after a deposition of a second layer of amorphous silicon followed by a controlled exposure to oxygen.

Referring now to FIG. 3, a thin amorphous silicon layer 31 (approximately 400Å) is now formed (i.e. deposited) either undoped or in-situ doped by a p or n-type dopant, such as arsenic, phosphorous of boron. At the end of this step, the grain boundaries at the interface are "frozen" or "locked" in by either an introduction of an impurity, such as oxygen, carbon, or $N_2O$, etc., or by exposing the silicon layer to an oxidizing ambient ($O_2$ or $H_2O$) or a nitridizing ambient ($N_2$ or $NH_3$). When the silicon grains at this interface are "locked" by a very slight oxidation, it is critical that this oxide film (grown or deposited) not be of too thick in that it will completely block conduction and out diffusion of dopants if the first layer is undoped (3-12Å of $SiO_2$ is preferred). It is also preferred that the silicon films be deposited insitu in an Rapid Thermal Chemical Vapor Deposition (RTCVD) based system, but an alternative manufacturing method would be to deposit the initial amorphous silicon layer in a Low Pressure Chemical Vapor Deposition (LPCVD) reactor either bleed in dilute $O_2$ or remove the wafers, thus exposing the silicon to the atmosphere and either directly reinsert the wafers or wet process the wafers using a dilute HF dip before re-inserting the wafers. These steps would thereby produce a native oxide on the top of the first deposited layer of silicon. Next, deposit an insitu doped layer of silicon (note: This second or center layer may be the sole source of dopant if the first and third layers are deposited undoped). Next bleed in $O_2$ or use the other methods (discussed above) for interface formation and then deposit the third silicon layer. The third silicon layer could be hemispherical grained polysilicon deposited by methods know to those skilled in the art, such as the method described in an article entitled "A New Cylindrical Capacitor Using Hemispherical Grained Si (HSG-Si) for 256Mb DRAMs," by Watanabe et al., 1992 IEDM, pp. 259-262, herein incorporated by reference.

Figure 5:
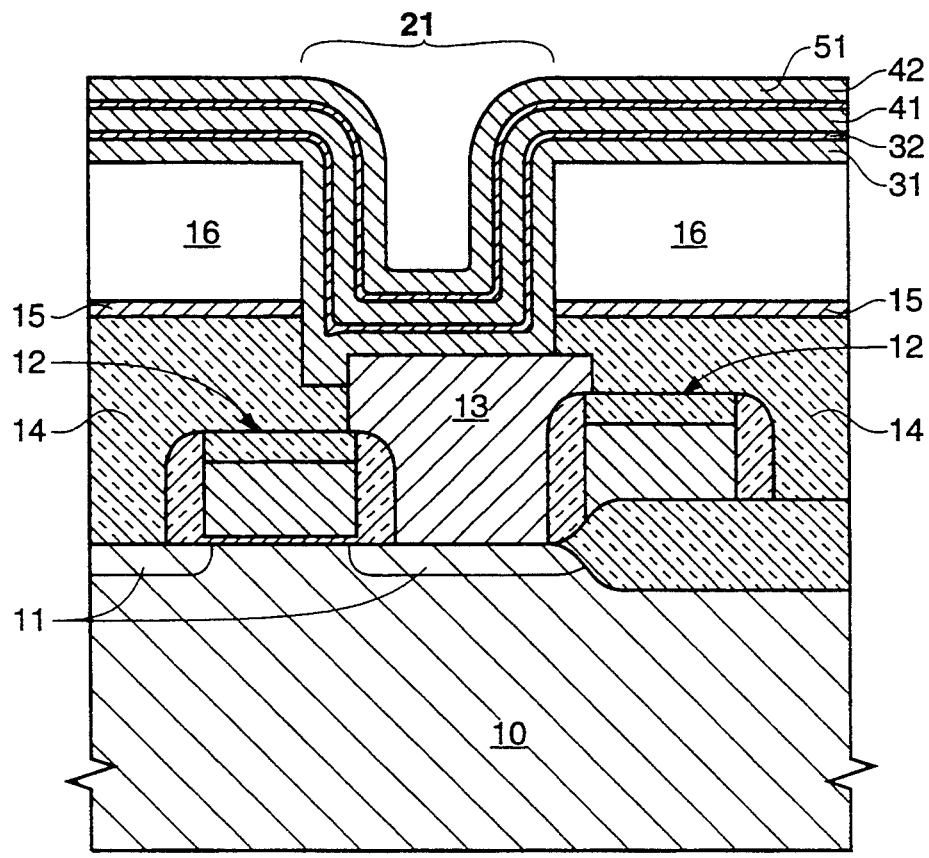
FIG. 5 is a cross-sectional view of the in-process wafer portion of FIG. 4 after a deposition of a third layer of amorphous silicon followed by a controlled exposure to oxygen.
Figure 6:
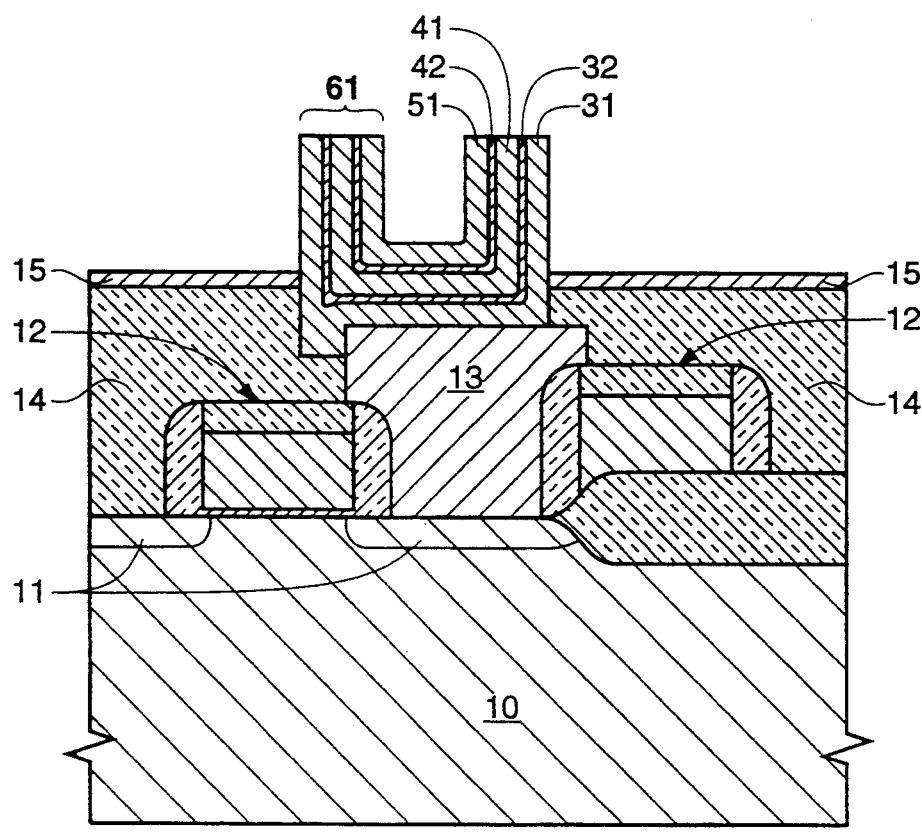
FIG. 6 is a cross-sectional view of the in-process wafer portion of FIG. 5 after performing chemical mechanical polishing to form individual storage nodes followed by an etch to remove the BPSG.

Referring now to FIG. 6, a stacked structure 61 of amorphous silicon results from being planarized (planarization by chemical mechanical polishing, or resist coat, $O_2$ plasma and poly etch) until oxide 16 is exposed which also separates each neighboring capacitor storage node plate from one another across the die. Next, a wet oxide etch back is performed to remove oxide 16 (seen in FIG. 5) with this etch stopping on nitride layer 15. As mentioned previously, nitride layer 15 is optional but also preferred in that it provides a definite each stopping target for the wet oxide etch. However, nitride layer 15 need not be used at all as one can rely on the different etching rates between layers 16 and 14 if different materials are used. For example, in the preferred embodiment, layer 14 is TEOS and layer 16 is borophosphosilicate glass (BPSG). Because, BPSG has a much higher etch rate compared to TEOS, the BPSG can safely be completely removed while still guaranteeing a sufficient thickness of TEOS to remain and provide adequate isolation to the underlying word lines 12.

Figure 7A:
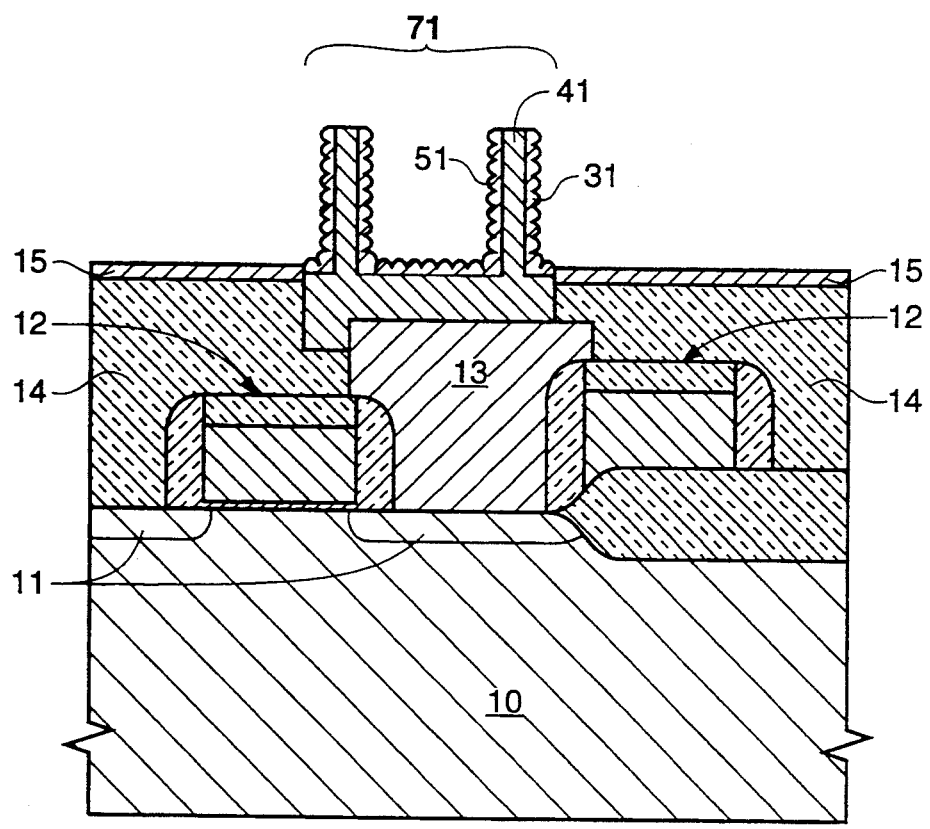
FIGS 7A and 7B are a cross-sectional view of the in-process wafer portion of FIG. 6 following formation of hemispherical grained polysilicon resulting from a high vacuum anneal.

Referring now to FIG. 7a, the planarized amorphous structure 61 is subjected to a high vacuum anneal to form hemispherical grained polysilicon (HSG) on both the inside and outside of structure 61. Rapid Thermal Processing (RTP) assisted heating may be used at high vacuum anneal to further promote HSG formation. The result is the HSG poly structure 71, which in this application, forms a capacitor storage node plate container 71. The amorphous silicon is converted into hemispherical grained polysilicon subjecting said structure to rapid thermal processing or a high vacuum anneal, whereby the silicon atoms from the first and last silicon layers are consumed while the silicon atoms of any inner silicon layer remain intact and do not penetrate the silicon interfacing layers.

Figure 7B:
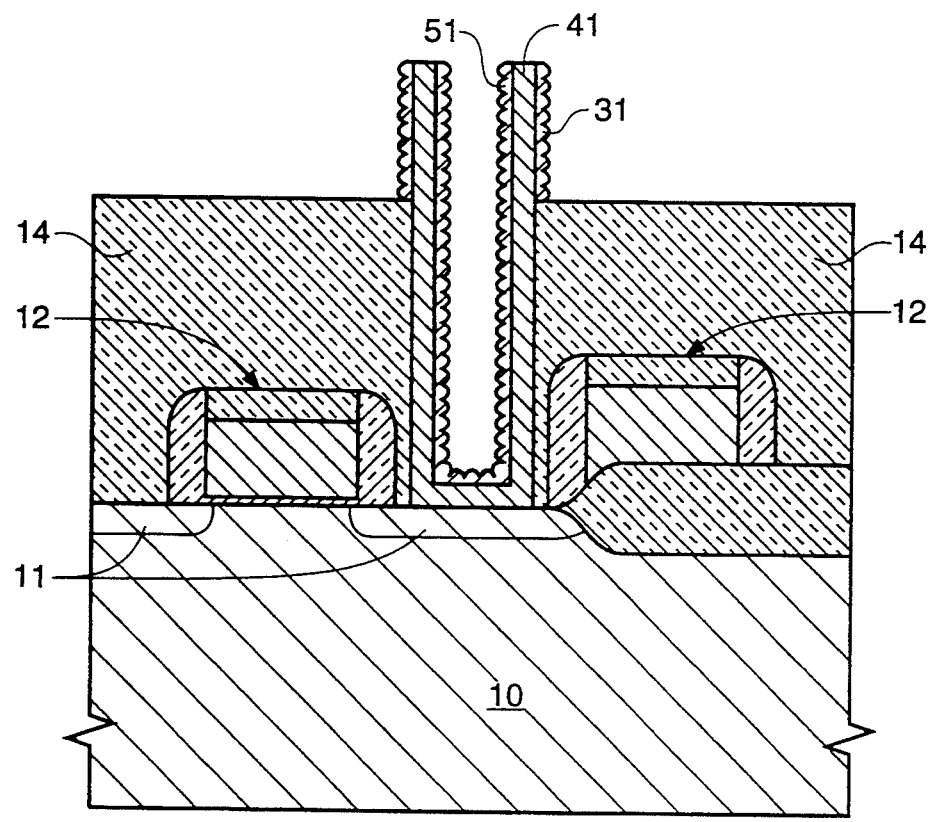

Alternately, FIG. 7b shows a completed capacitor storage node plate container 71 that makes direct contact to diffusion area 11 and thus not using a poly plug interconnect.

Figure 8:
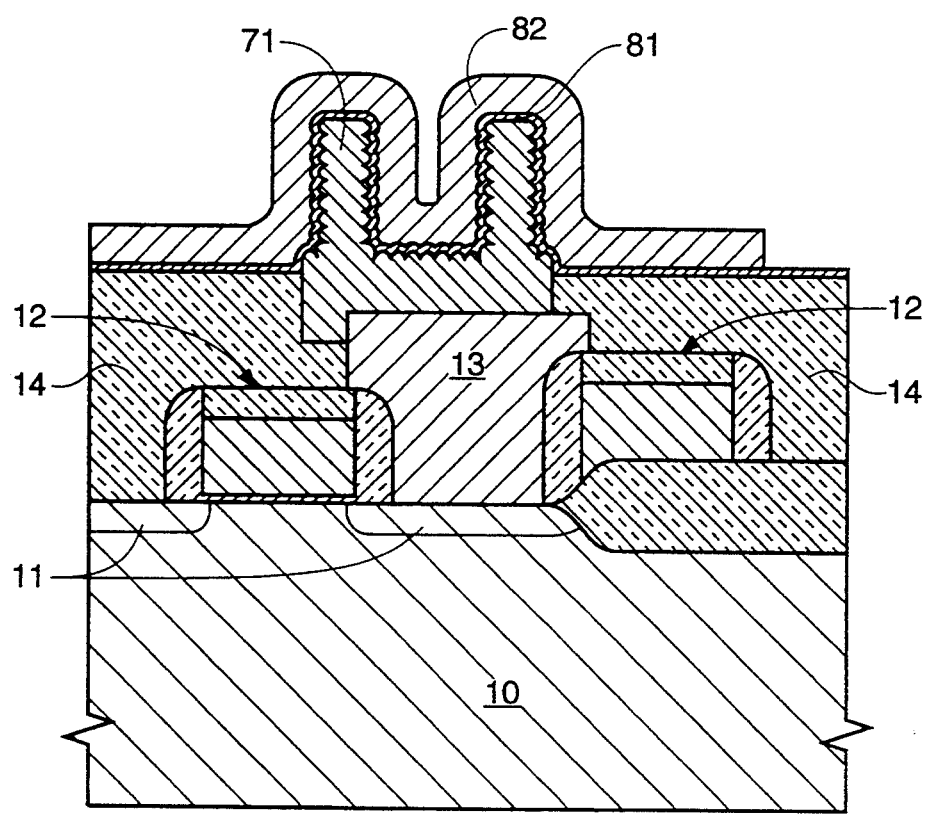
FIG. 8 is a cross-sectional view of the in-process wafer portion FIG. 7 following the formation of conformal cell dielectric and polysilicon, respectively.

Referring now to FIG. 8, container 71 is coated with a capacitor cell dielectric 81. Finally, a doped conformal poly layer 82 blankets cell dielectric 81 and serves as a common capacitor cell plate to an entire array of containers 71. From this point on the wafer is completed using conventional fabrication process steps.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A process for fabricating a conductive container structure on a supporting substrate, said process comprising the steps of:

forming a planarized insulating layer;
forming an opening into said planarized layer;
forming multiple layers of silicon into said opening, wherein the first and last layers formed comprise amorphous silicon;

forming multiple silicon interfacing layers at the silicon grain boundaries between each layer, thereby separating each said silicon layer with an oxide layer;

forming individual container structures having inner and outer surfaces and thereby exposing said planarized insulating layer;

partially removing said planarized insulating layer thereby exposing said outer surface of said container structures;

covering said exposed inner and outer surfaces of amorphous silicon into hemispherical grained polysilicon by subjecting said inner and outer surfaces to a high vacuum anneal;

forming an insulating layer adjacent and coextensive said conductive container structure; and forming a conductive layer superjacent and coextensive said insulating layer.

2. The process as recited in claim 1, wherein said process further comprises forming a conductive plug between a pair of neighboring parallel conductive lines prior to said formation of said first planarized insulating layer.

3. The process as recited in claim 1, wherein said supporting substrate comprises a silicon substrate.

4. The process as recited in claim 2, wherein said conductive plug comprises conductively doped polysilicon.

5. The process as recited in claim 1, wherein said planarized insulating layer comprises tetra-ethyl-ortho-silicate (TEOS).

6. The process as recited in claim 1, wherein said planarized insulating layer is planarized by chemical mechanical polishing.

7. The process as recited in claim 1, wherein additional first and second insulating layers are formed on said planarized insulating layer.

8. The process as recited in claim 7, wherein said first insulating layer comprises nitride and second insulating layer comprises borophosphosilicate glass (BPSG).

9. The process as recited in claim 1, wherein said converting the amorphous silicon into hemispherical grained polysilicon further comprises subjecting said structure to rapid thermal processing, whereby silicon atoms from said first and last silicon layers are consumed while the silicon atoms of an inner silicon layer remain intact and do not penetrate said silicon interfacing layers.

10. The process as recited in claim 1, wherein said converting the amorphous silicon into hemispherical grained polysilicon further comprises subjecting said structure to a high vacuum anneal, whereby silicon atoms from said first and last silicon layers are consumed while the silicon atoms of an inner silicon layer remain intact and do not penetrate said silicon interfacing layers.

11. The process as recited in claim 1, wherein said multiple layers comprise a first, a second and a third layer.

12. The process as recited in claim 11, wherein said second layer comprises conductively doped amorphous silicon.

13. The process as recited in claim 11, wherein said second layer comprises conductively doped polysilicon.

14. The process as recited in claim 12, wherein said first and third silicon layers are initially deposited undoped and are later doped by an out diffusion of dopant impurities present in said second silicon layer that is conductively doped.

15. The process as recited in claim 12, wherein said first and third layers comprise silicon layers that are initially deposited as doped layers.

16. The process as recited in claim 12, wherein said first layer is initially deposited as an undoped silicon layer and said third layer is initially deposited as doped silicon layer.

17. The process as recited in claim 12, wherein said first layer is initially deposited as a doped layer and said third layer is initially deposited as an undoped layer.

18. The process as recited in claim 1, wherein said forming multiple silicon interfacing layers at the silicon grain boundaries comprises introducing an impurity at said grain boundaries, wherein said impurity is selected from the group consisting of oxygen, carbon, and $N_2O$.

19. The process as recited in claim 1, wherein said forming multiple silicon interfacing layers at the silicon grain boundaries comprises exposing each silicon layer to an oxidizing ambient material.

20. A process for fabricating a DRAM container storage capacitor on a silicon substrate, said process comprising the steps of:

forming parallel conductive lines on said substrate;

forming a conductive plug between said pair of neighboring parallel conductive lines;

forming a first planarized insulating layer over said parallel conductive lines and said conductive plug;

forming a planarized second insulating layer over said first planarized insulative layer;

forming an opening into said second insulating layer and said first insulating layer to expose an upper surface of said conductive plug;

forming multiple layers of amorphous silicon into said opening and forming multiple silicon interfacing layers at the silicon grain boundaries, thereby separating each said silicon layer with an oxide layer;

forming individual container structures having inner and outer surfaces and thereby exposing said second insulating layer;

removing said second insulating layer thereby exposing said outer surface of said container structures;

converting said exposed inner and outer surfaces of amorphous silicon into hemispherical grained polysilicon by subjecting said structures to a high vacuum anneal;

forming a third insulating layer adjacent and coextensive said conductive container structure; and forming a second conductive layer superjacent and coextensive said third insulating layer.

21. The process as recited in claim 20, wherein said conductive plug comprises conductively doped polysilicon.

22. The process as recited in claim 20, wherein said first insulating layer comprises tetra-ethyl-ortho-silicate (TEOS).

23. A process as recited in claim 20, wherein said second insulating layer comprises borophosphosilicate glass (BPSG).

24. A process as recited in claim 20, wherein said first and second insulating layers are planarized.

25. A process as recited in claim 24, wherein said planarization comprises chemical mechanical polishing.

26. A process as recited in claim 20, wherein an additional insulating layer is formed between said first and second insulating layers.

27. A process as recited in claim 20, wherein said additional insulating layer comprises nitride.

28. A process as recited in claim 20, wherein said converting the amorphous silicon into hemispherical grained polysilicon further comprises rapid thermal processing.

29. The process as recited in claim 20, wherein said third insulating layer comprises nitride.

30. The process as recited in claim 20, wherein said second conductive layer comprises conductively doped silicon.

31. A process for fabricating a DRAM container storage capacitor on a silicon substrate, said process comprising the steps of:

forming parallel conductive lines on said substrate;

forming a conductively doped polysilicon plug between said pair of neighboring parallel conductive word lines;

forming a planarized tetra-ethyl-ortho-silicate (TEOS) insulating layer over said parallel conductive word lines and said plug;

forming a planarized borophosphosilicate glass (BPSG) insulating layer over said planarized tetra-ethyl-ortho-silicate (TEOS) insulative layer;

forming an opening into both insulating layers to expose an upper surface of said plug;

forming first, second and third layers of conductively doped amorphous silicon in said opening and forming multiple silicon interfacing layers at the silicon grain boundaries, thereby separating each said conductively doped amorphous silicon layer with an oxide layer;

forming individual container structures having inner and outer surfaces and thereby exposing said BPSG insulating layer;

removing said BPSG insulating layer thereby exposing said outer surface of said container structures;

converting said exposed inner and outer surfaces of amorphous silicon into hemispherical grained polysilicon by subjecting said structures to a high vacuum anneal;

forming a nitride insulating layer adjacent and coextensive said conductive container structure; and forming a second conductively doped polysilicon layer superjacent and coextensive said nitride insulating layer.

32. A process as recited in claim 31, wherein planarization comprises chemical mechanical polishing.

33. A process as recited in claim 32, wherein an additional nitride insulating layer is formed between said TEOS and BPSG insulating layers.

34. The process as recited in claim 31, wherein said converting the amorphous silicon into hemispherical grained polysilicon further comprises rapid thermal processing.

* * * * *